US012604608B2

(12) United States Patent
Qin et al.

(10) Patent No.: US 12,604,608 B2
(45) Date of Patent: Apr. 14, 2026

(54) DISPLAY PANEL AND DISPLAY DEVICE

(71) Applicant: Hubei Yangtze Industrial Innovation Center Of Advanced Display Co., Ltd., Wuhan (CN)

(72) Inventors: Feng Qin, Wuhan (CN); Jun Yan, Wuhan (CN); Yuan Ding, Wuhan (CN); Linshan Guo, Wuhan (CN); Jiaxian Liu, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 586 days.

(21) Appl. No.: 18/062,083

(22) Filed: Dec. 6, 2022

(65) Prior Publication Data

US 2023/0108911 A1    Apr. 6, 2023

(30) Foreign Application Priority Data

Jun. 30, 2022    (CN) .......................... 202210767469.2

(51) Int. Cl.
H10K 50/854        (2023.01)
H10K 50/86        (2023.01)
(Continued)

(52) U.S. Cl.
CPC ......... H10K 50/854 (2023.02); H10K 50/865 (2023.02); H10K 59/35 (2023.02); *H10K 59/12* (2023.02)

(58) Field of Classification Search
CPC ..... H10K 50/854; H10K 50/865; H10K 59/35
See application file for complete search history.

(56) References Cited

U.S. PATENT DOCUMENTS

2007/0200492 A1*    8/2007    Cok ..................... H10K 59/877
                                                      313/506
2011/0042697 A1*    2/2011    Lee ..................... H10K 59/877
                                                      257/89
(Continued)

FOREIGN PATENT DOCUMENTS

CN        102771188 A      11/2012
CN        108957836 A      12/2018
(Continued)

OTHER PUBLICATIONS

First Chinese Office Action mailed on Mar. 27, 2025, issued in Chinese Application No. 202210767469.2; 16 pages.

*Primary Examiner* — Abdulmajeed Aziz
*Assistant Examiner* — Nathaniel J Lee
(74) *Attorney, Agent, or Firm* — CHRISTENSEN O'CONNOR JOHNSON KINDNESS PLLC

(57)        ABSTRACT

Provided is a display panel, comprising a substrate and light-emitting units on a side of the substrate; a black matrix, located on a side of the light-emitting unit way from the substrate, and provided with black matrix openings, a black matrix opening corresponds to a light-emitting unit; and a filter layer, comprising color-resistance units which are disposed in the black matrix openings and at least partially overlap with the light-emitting units of the same color in a direction perpendicular to a plane of the display panel; a color-resistance unit includes microparticles having a particle size, and a difference between the particle size and a wavelength of light emitted by a corresponding light-emitting unit is within a preset range, and the light-emitting units of different colors correspond to different particle sizes of the microparticles of the color-resistance units.

20 Claims, 10 Drawing Sheets

(51) Int. Cl.
  H10K 59/12        (2023.01)
  H10K 59/35        (2023.01)

(56)                References Cited

U.S. PATENT DOCUMENTS

| | | | | |
|---|---|---|---|---|
| 2013/0320842 A1* | 12/2013 | Park | ............ | H10K 59/8792 |
| | | | | 313/512 |
| 2014/0192294 A1* | 7/2014 | Chen | ............ | G02F 1/133621 |
| | | | | 362/293 |
| 2014/0339509 A1* | 11/2014 | Choi | ............ | H10K 59/879 |
| | | | | 257/40 |
| 2015/0077966 A1* | 3/2015 | Bessho | ............ | H05B 33/14 |
| | | | | 362/19 |
| 2016/0041313 A1* | 2/2016 | Lee | ............ | G02B 5/0263 |
| | | | | 359/599 |
| 2017/0352841 A1* | 12/2017 | Lee | ............ | H10K 50/854 |
| 2023/0189609 A1* | 6/2023 | Wu | ............ | H10K 59/877 |
| | | | | 257/40 |

FOREIGN PATENT DOCUMENTS

| | | | | |
|---|---|---|---|---|
| CN | 111162104 A | | 5/2020 | |
| CN | 111900193 A | * | 11/2020 | ........... H10K 59/877 |
| CN | 112670431 A | | 4/2021 | |
| CN | 114664907 A | | 6/2022 | |

* cited by examiner

100

100

200

100

DISPLAY PANEL AND DISPLAY DEVICE

CROSS REFERENCE TO RELATED APPLICATIONS

The present application claims to the benefit of Chinese Patent Application No. CN 202210767469.2, filed on Jun. 30, 2022, the content of which is incorporated herein by reference in its entirety.

TECHNICAL FIELD

This application relates to the field of display technology, in particular to a display panel and a display device.

BACKGROUND

Organic light-emitting diodes (OLEDs) display panel have the advantages of simple manufacturing process, low power consumption, light weight, fast response, wide viewing angle, high resolution, wide temperature characteristics and etc. Therefore, OLEDs have an immense market application prospect.

In the existing OLED display panels, in order to reduce a thickness of the display panel and save power consumption, a polarizer is usually not provided. As a result, the reflected light generated by external light irradiation on the display panel is prone to result in a dispersion phenomenon, which affects the experience of the user.

SUMMARY

Based on the above disclosure, the embodiment of the present disclosure provides a display panel and display device to solve the above issues.

In a first aspect, the present disclosure provides a display panel comprising a substrate; light-emitting units on a side of the substrate; a black matrix, located on a side of the light-emitting unit away from the substrate, and provided with black matrix openings, wherein a black matrix opening of the black matrix openings corresponds to a light-emitting unit of the light-emitting units; and a filter layer, comprising color-resistance units which fill the black matrix openings and at least partially overlap with the light-emitting units of the same color in a direction perpendicular to a plane of the display panel; wherein a color-resistance unit of the color-resistance units includes microparticles having a particle size, and a difference between the particle size and a wavelength of light emitted by a corresponding light-emitting unit is within a preset range, and the particle sizes of the microparticles of the color-resistance units corresponding to the light-emitting units of different colors are different.

In a second aspect, the embodiment of the present disclosure provides a display device including a display panel, the display panel comprises a substrate; light-emitting units on a side of the substrate; a black matrix, located on a side of the light-emitting unit away from the substrate, and provided with black matrix openings, wherein a black matrix opening of the black matrix openings corresponds to one light emitting unit of the light-emitting units; and a filter layer, comprising color-resistance units which fill the black matrix openings and at least partially overlap with the light-emitting units of the same color in a direction perpendicular to a plane of the display panel; wherein one color-resistance unit of the color-resistance units includes microparticles having a particle size, and a different between the particle size and a wavelength of light emitted by a corresponding light emitting unit is within a preset range, and the particle sizes of the microparticles of the color-resistance units corresponding to the light-emitting units of different colors are different.

BRIEF DESCRIPTION OF DRAWINGS

In order to more clearly explain the embodiments of the present disclosure, the drawings used in the description of the embodiments will be briefly described below. The drawings in the following description are some embodiments of the present disclosure. Those skilled in the art can obtain other drawings based on these drawings without creative efforts.

DETAILED DESCRIPTION

For better understanding of the technical solutions of the present disclosure, the embodiments of the present disclosure are described in detail below with reference to the accompanying drawings.

It should be noted that the embodiments in the following descriptions are only a part rather than all of the embodiments in the present disclosure. All other embodiments obtained by those skilled in the art based on the embodiments of the present disclosure should also fall within the protection scope of the present disclosure.

Terms in the embodiments of the present disclosure are merely used to describe the specific embodiments, and are not intended to limit the present disclosure. Unless otherwise specified in the context, words, such as "a", "the", and "this", in a singular form in the embodiments of the present disclosure and the appended claims include plural forms.

It should be understood that the term "and/or" in this specification merely describes associations between associated objects, and it indicates three types of relationships. For example, A and/or B may indicate that A exists alone, A and B coexist, or B exists alone. In addition, the character "/" in this specification generally indicates that the associated objects are in an "or" relationship.

In this specification, it should be understood that the terms "basically", "approximately", "about", "generally" and "substantially" described in claims and embodiments of the present disclosure refer to a substantially approved value, rather than an exact value, within a reasonable process operation range or tolerance range.

It should be understood that although the terms "first", "second" and "third" can be used in the present disclosure to describe colors, microparticles, display areas, etc., these colors, microparticles, display areas, etc. should not be limited to these terms. These terms are only used to distinguish colors, microparticles, display areas, etc., from each other. For example, without departing from the scope of the embodiments of the present disclosure, a first micro particle can also be referred to as a second micro particle. Similarly, a second micro particle can also be referred to as a first micro particle.

Conventionally, the metal film layer in the display panel usually does not have a flat structure, when the external light is projected on these metal films, the emergent angles of the reflected light are not consistent, such that color dispersion phenomena is easy to occur in the display panel. In particular, the dispersion phenomenon is especially pronounced in a screen-off state of the display panel, affecting the look and feel of the user.

It has been surprisingly found that altering the original emitting direction of the reflected light can effectively improve the dispersion problem after research. Therefore, this provides a solution to alter the original emitting direction of the reflected light by taking advantage of light dispersion.

Figure 1:
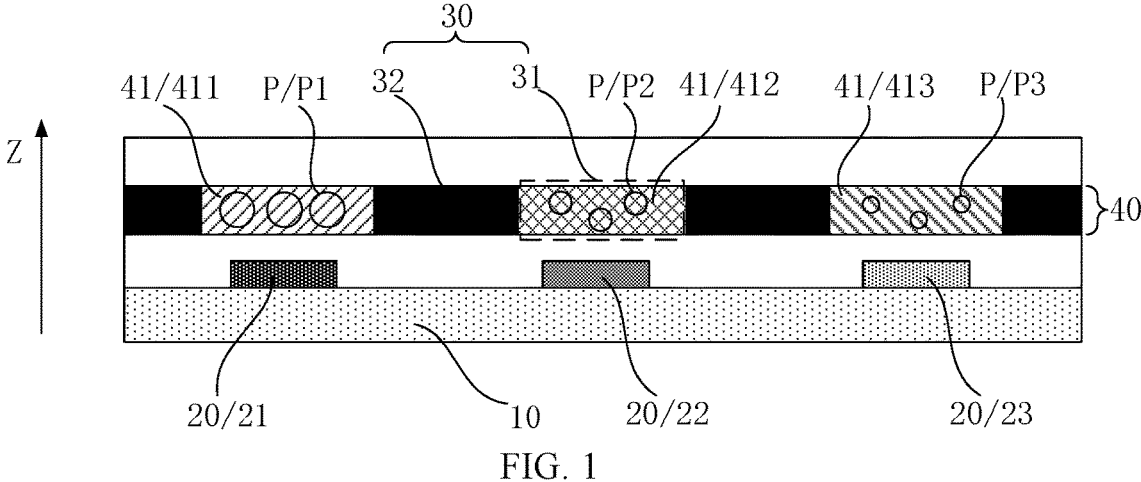
FIG. 1 is a structural schematic diagram of a display panel according to an embodiment of the present disclosure.
Figure 2:
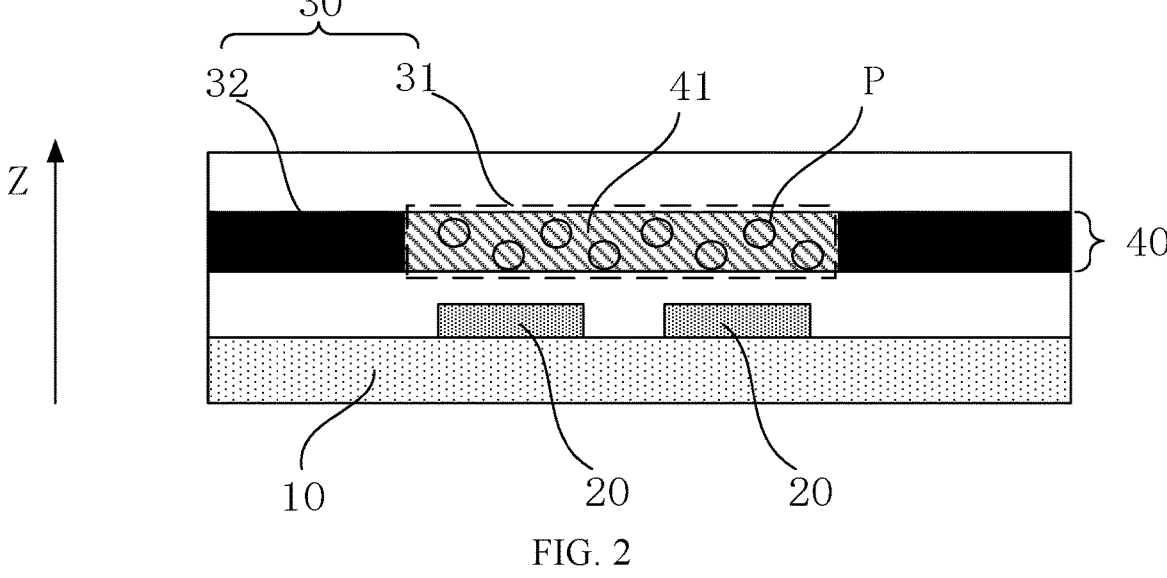
FIG. 2 is a structural schematic diagram of another display panel according to an embodiment of the present disclosure.

FIG. 1 is a structural schematic diagram of a display panel according to an embodiment of the present disclosure. FIG. 2 is a structural schematic diagram of another display panel according to an embodiment of the present disclosure.

The embodiment of the present disclosure provides a display panel 100, as shown in FIG. 1, the display panel 100 comprises a substrate 10 and light-emitting units 20 located at a side of the substrate 10, a black matrix 30, and a filter layer 40. The black matrix 30 is located on a side of the light-emitting unit 20 away from the substrate 10. The black matrix 30 includes black matrix openings 31 and the black matrix openings 31 correspond to light-emitting units 20, that is, along a direction Z perpendicular to a plane of display panel 100, black matrix openings 31 at least partially overlap with light-emitting units 20. The light emitted from the light-emitting unit 20 exits through the black matrix opening 31.

In an embodiment, as shown in FIG. 1, the black matrix openings 31 are configured to have a one-to-one correspondence with the light-emitting units 20.

In an embodiment, as shown in FIG. 2, a black matrix opening 31 corresponds to two adjacent light-emitting units 20 and the light emitted by the two adjacent light-emitting units 20 is of the same color.

The filter layer 40 includes color-resistance units 41, and the color-resistance units 41 fill the black matrix openings

31, and the same black matrix opening 31 is filled with the color-resistance unit 41 of the same color. Along the direction Z perpendicular to the plane of the display panel 100, the color-resistance unit 41 at least partially overlaps with the light-emitting unit 20 of the same color. That is, light emitted by the light-emitting unit 20 is emitted through the color-resistance unit 41 having the same color of the light.

It should be noted that the color of light-emitting unit 20 in this disclosure refers to the color of light emitted by the light-emitting unit 20.

The color-resistance unit 41 includes microparticles P. The difference between a particle size of the microparticles P and a wavelength of light emitted by the corresponding light-emitting unit 20 is within a preset range, and particle sizes of the microparticles P in the color-resistance units 41 corresponding to the light-emitting units 20 of different colors are different. In other words, particle sizes of the microparticles P in the color-resistance units 41 overlapping with the light-emitting units 20 of different colors are different along the direction Z perpendicular to the plane of the display panel 100.

In an embodiment, the microparticle P is selected from at least one of titanium oxide particles, silica particles, or zirconia particles.

In an embodiment, at least part of the pigment particles in color-resistance units 41 are microparticles P.

The difference between the particle size of the microparticles P and the wavelength of the light emitted by the corresponding light-emitting unit 20 can be within a range of 0-50 nm.

For example, the particle size of the microparticle P is d, and the wavelength of the light emitted by the corresponding light-emitting unit 20 is $\lambda$, and $-50 \text{ nm} \leq (\lambda - d) \leq 50 \text{ nm}$.

It should be noted that, a wavelength of the light emitted by the light-emitting unit 20 is generally within a certain range, and a wavelength of the light emitted by the light-emitting unit 20 can be understood as a central wavelength of the light.

It is understood that at least part of the reflected light produced by the external ambient light projected on the display panel 100 will emit through the color-resistance unit 41, and the color of the reflected light will be the same as that of the color-resistance unit 41 through the reflected light passes. In other words, the reflected light emitted by the color-resistance unit 41 is of the same wavelength and same color as the light emitted by the corresponding light-emitting unit 20 of the color-resistance unit 41.

In an embodiment of the present disclosure, color-resistance units 41 of different colors can absorb visible light of other wavelengths excluding its own color wavelength, such that a reflectivity of the display panel 100 is relatively low. Therefore, there is no need to set additional polarizer in the display panel 100 to eliminate the reflected light. Moreover, the color-resistance unit 41 can be fabricated directly on the substrate below it, requiring no additional adhering techniques, which is beneficial to reduce a thickness of the display panel 100 and improve the light output efficiency. The display panel 100 provided in this embodiment of the present disclosure can be set to be thinner to meet the user's demand for lightness and thinness of the product.

In addition, in an embodiment of the present disclosure, the microparticles P are disposed in color-resistance unit 41, and the particle sizes of microparticles P are similar to the wavelengths of light emitted by corresponding light-emitting units 20. Reflected light will be scattered when it is incident on the corresponding color-resistance unit 41, which destroys original emergent direction of the reflected light, and disperses the emergent direction of the reflected light, thereby the dispersion problem in the display panel can be improved and the user's experience can be improved. Moreover, when light emitted by the light-emitting unit 20 is emitted through corresponding color-resistance unit 41, the light will be scattered, which increases an emergent angle, and is beneficial to improve the emergent angle of the display panel 100.

Refer further to FIG. 1, in one embodiment of the present disclosure, the display panel 100 light-emitting units 20, and the 20 includes a first color light-emitting unit 21 and a second color light-emitting unit 22. The color-resistance units 41 include a first color-resistance unit 411 and a second color-resistance unit 412. The microparticle P in the first color-resistance unit 411 is a first microparticle P1, and the microparticle Pin the second color-resistance unit 412 is a second microparticle P2.

The first color color-resistance unit 411 at least partially overlaps with the first color light-emitting unit 21, and the second color color-resistance unit 412 at least partially overlaps with the second color light-emitting unit 22 along the direction Z perpendicular to the plane of display panel 100.

In other words, the first color light-emitting unit 21 corresponds to the first color color-resistance unit 411, and a first color light emitted by the first color light-emitting unit 21 is emitted through the first color color-resistance unit 411. The second color light-emitting unit 22 corresponds to the second color color-resistance unit 412, and a second color light emitted by the second color light-emitting unit 22 is emitted through the second color color-resistance unit 412.

A wavelength of the first color light emitted by the first color light-emitting unit 21 is λ1, a wavelength of the second color light emitted by the second color light-emitting unit 22 is λ2, a particle size of the first microparticle P1 is d1, a particle size of the second microparticle P2 is d2, and (λ1−λ2)*(d1−d2)>0.

It should be noted that the particle size d1 of the first microparticle P1 can be an average particle size of the first microparticle P1 in the first color color-resistance unit 411, and the particle size d2 of the second microparticle P2 can be an average particle size of the second microparticle P2 in the second color color-resistance unit 412.

In an embodiments of the present disclosure, when the wavelength λ1 of the first color light emitted by the first color light-emitting unit 21 is greater than the wavelength λ2 of the second color light emitted by the second color light-emitting unit 22, then the particle size d1 of the first microparticle P1 in the first color color-resistance unit 411 corresponding to the first color light-emitting unit 21 is larger than the particle size d2 of the second microparticle P2 in the second color color-resistance unit 412 corresponding to the second color light-emitting unit 22, that is, when λ1>λ2, d1>d2.

When the wavelength λ1 of the first color light emitted by the first color light-emitting unit 21 is smaller than the wavelength λ2 of the second color light emitted by the second color light-emitting unit 22, then the particle size d1 of the first microparticle P1 in the first color color-resistance unit 411 corresponding to the first color light-emitting unit 21 is smaller than the particle size d2 of the second microparticle P2 in the second color color-resistance unit 412 corresponding to the second color light-emitting unit 22, that is, if λ1<λ2, then d1<d2. In an embodiment of the present disclosure, the particle size of the microparticle P in the color-resistance unit 41 corresponding to the light-emitting unit 20 emitting light of a shorter wavelength is smaller, the particle size of P in the color-resistance unit 41 corresponding to the light-emitting unit 20 emitting light with a longer wavelength is larger. That is, the light is emitted through micro-particle P whose particle size corresponds to its wavelength. The reflection and refraction of light generated among microparticles P of a particle size equal to wavelength of the light can be superimposed with interference and refraction of the light, so as to further increase the emergent angle and adjust the display effect of the display panel 100.

Refer further to FIG. 1, in one embodiment of the present disclosure, light-emitting units 20 also includes a third color light-emitting unit 23. Color-resistance units 41 also include a third color-resistance unit 413, the micro-particle P in the third color-resistance unit 413 is a third micro-particle P3.

The third color color-resistance unit 413 at least partially overlaps with the third color light-emitting unit 23 along the direction Z perpendicular to the plane of display panel 100. That is, the third color light-emitting unit 23 corresponds to the third color color-resistance unit 413, and the third color light emitted by the third color light-emitting unit 23 is emitted through the third color color-resistance unit 413.

A wavelength of the third color light emitted by the third color light-emitting unit 23 is λ3, and a particle size of third microparticle P3 is d3, and (λ2−λ3)*(d2−d3)>0.

It should be noted that the particle size d3 of the third microparticle P3 can be an average particle size of the third microparticles P3 in the third color color-resistance unit 413.

In an embodiment of the present disclosure, when the wavelength λ2 of the second color light emitted by the second color light-emitting unit 22 is greater than the wavelength λ3 of the third color light emitted by the third color light-emitting unit 23, then the particle size d2 of the second microparticle P2 in the second color color-resistance unit 412 corresponding to the second color light-emitting unit 22 is larger than the particle size d3 of the third microparticle P3 in the third color color-resistance unit 413 corresponding to the third color light-emitting unit 23, that is, when λ2>λ3, d2>d3.

When the wavelength λ2 of the second color light emitted by the second color light-emitting unit 22 is smaller than the wavelength λ3 of the first color light emitted by the third color light-emitting unit 23, then the particle size d2 of the second microparticle P2 in the second color color-resistance unit 412 corresponding to the second color light-emitting unit 22 is smaller than the particle size d3 of the third microparticle P3 in the third color color-resistance unit 413 corresponding to the third color light-emitting unit 23, that is, when λ2<λ3, d2<d3.

In an embodiment of the present disclosure, (λ1−λ2)> (λ2−λ3) and (d1−d2)>(d2−d3).

In other words, when a difference between the wavelength λ1 of the first color light emitted by the first color light-emitting unit 21 and the wavelength λ2 of the second color light emitted by the second color light-emitting unit 22 is greater than a difference between the wavelength λ2 of the second color light emitted by the second color light-emitting unit 22 and the wavelength λ3 of the third color light emitted by the third color light-emitting unit 23, then a difference between the particle size d1 of the first microparticle P1 in the first color color-resistance unit 411 corresponding to the first color light-emitting unit 21 and the particle size d2 of the second microparticle P2 in the second color color-resistance unit 412 corresponding to the second color light-emitting unit 21 is greater than a difference between the particle size d2 of the second microparticle P2 in the second color color-resistance unit 412 corresponding to the second color light-emitting unit 22 and the particle size d3 of the third microparticle P3 in the third color color-resistance unit 413 corresponding to the third color light-emitting unit 23.

The wavelength of the first color light can be a central wavelength of the first color light, the wavelength of the second color light can be a central wavelength of the second color light, and the wavelength of the third color light can be a central wavelength of the third color light. In an embodiment, the first color color-resistance unit 411 is a red color-resistance unit, the second color color-resistance unit 412 is a green color-resistance unit, and the third color color-resistance unit 413 is a blue color-resistance unit. Certainly, the first color light-emitting unit 21 can be a red light-emitting unit, the second color light-emitting unit 22 can be a green light-emitting unit, and the third color light-emitting unit 23 can be a blue light-emitting unit. The particle size d3 of the third microparticle P3 can be smaller than the particle size d2 of the second microparticle P2, and the particle size d2 of the second microparticle P2 can be smaller than the particle size d1 of the first microparticle P1.

Furthermore, the particle size d1 of the first microparticle P1 can be within a range of 600-800 nm, the particle size d2 of the second microparticle P2 can be within a range of 480-580 nm, and the particle size d3 of the third microparticle P3 can be within a range of 380-550 nm.

Figure 3:
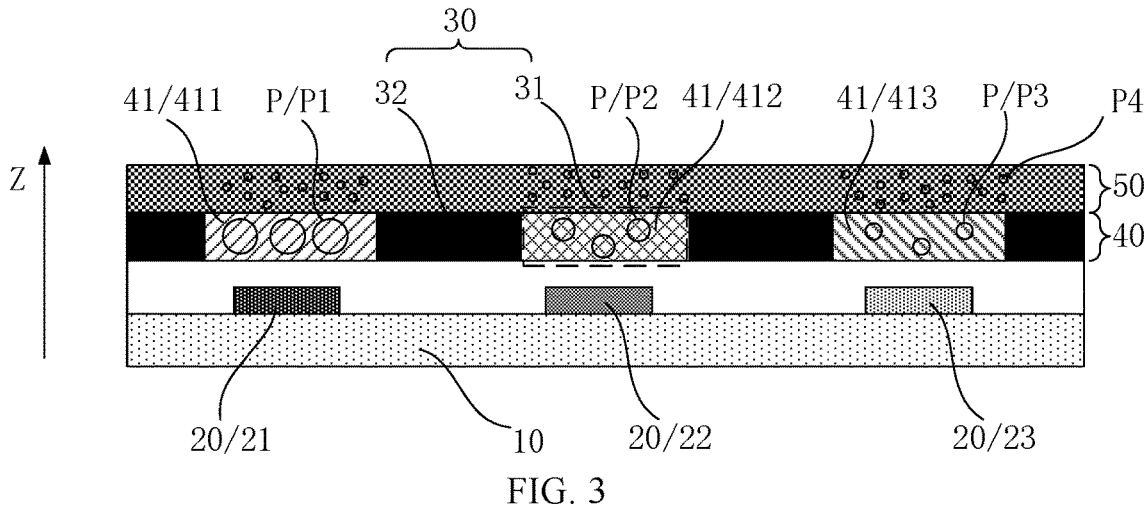
FIG. 3 is a structural schematic diagram of another display panel according to an embodiment of the present disclosure.

FIG. 3 is a structural schematic diagram of another display panel according to an embodiment of the present disclosure.

As shown in FIG. 3, in the embodiment of the present disclosure, the display panel 100 further includes a first film layer 50, which is located on a side of the filter layer 40 away from the substrate 10, and the first film layer 50 covers the filter layer 40.

the first film layer 50 is further provided with a fourth microparticle P4, and a particle size of the fourth microparticle P4 is d4, and d4<d3.

In other words, the particle size d4 of the fourth microparticle P4 is smaller than the particle size d3 of the third microparticle P3. The third microparticle P3 can be the microparticle P in the blue color-resistance unit.

Based on the above embodiments, it can be found that the particle size d3 of the third microparticle P3 can be smaller than the particle size d2 of the second microparticle P2 and smaller than the particle size d1 of the first microparticle P1. The particle size d4 of the fourth microparticle P4 is smaller than the particle size d3 of the third microparticle P3, such that the particle size d4 of the fourth microparticle P4 can be smaller than the particle size of the microparticle P in the filter layer 40.

The first film layer 50 can be a flattening layer, and setting the particle size of the fourth microparticle P4 to be smaller is conducive to making the first film layer 50 relatively flat. Moreover, the first film layer 50 can also be a transparent layer. Setting the particle size of the fourth microparticle P4 to be smaller can also improve a haze of the first film layer 50, which is conducive to improving the display effect.

In an embodiment, 0<d4≤100 nm.

Furthermore, a refractive index of the fourth microparticle P4 is greater than a refractive index of the third microparticle P3.

It should be noted that the first layer 50 can be set as a whole surface.

In the embodiments of the present disclosure, the particle size d4 of the fourth microparticle P4 is set to be smaller and the refractive index of the fourth microparticle P4 is set to be larger, which is beneficial to improve the haze of the first film layer 50, so as to further disperse an emergent direction of the reflected light and improve the dispersion problem in the display panel 100.

Figure 4:
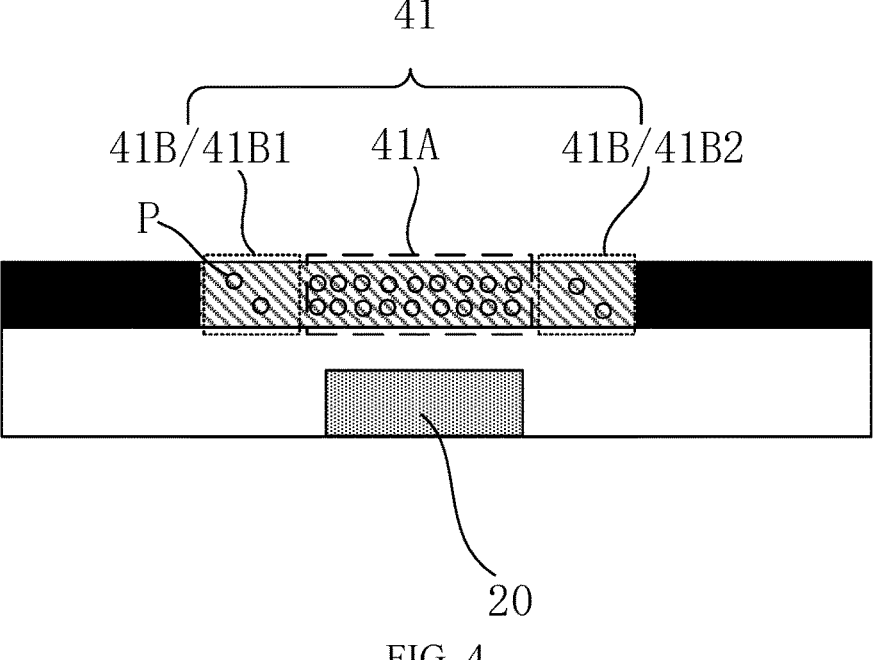
FIG. 4 is a partial structural schematic diagram of a display panel according to an embodiment of the present disclosure.

FIG. 4 is a partial structural schematic diagram of a display panel according to an embodiment of the present disclosure.

In an embodiment of the present disclosure, as shown in FIG. 4, the color-resistance unit 41 includes a middle portion 41A and an edge portion 41B, and the concentration of microparticles P in the edge portion 41B is smaller than that in the middle portion 41A in the same color-resistance unit 41.

The edge portion 41B can include a first edge portion 41B1 and a second edge portion 41B2, which are located on both sides of the middle portion 41A respectively. The middle portion 41A of the color-resistance unit 41 can be the part that overlaps with the light-emitting unit 20.

In the display panel 100, an emergent path of light emitted by light-emitting unit 20 through the edge portion 41B is usually long, and due to the influence by a preparation process of color-resistance unit 41, a thickness of edge portion 41B in the same color-resistance unit 41 is prone to be thicker, which further increases a path length of the light emitted through edge portion 41B. As a result, there is more loss of light emergent through the edge portion 41B, which leads to a brightness difference of the display areas corresponding to the middle portion 41A and to the edge portion 41B respectively, thereby affecting a brightness uniformity of the display panel 100.

Therefore, in an embodiment of the present disclosure, setting the concentration of microparticles P in the middle portion 41A to be relatively higher and the concentration of microparticles P in the edge portion 41B to be relatively lower is conducive to improving a transmittance of the edge portion 41B, thereby increasing the brightness of the light emergent through the edge portion 41B, and reduce the brightness difference between the display areas corresponding to the middle portion 41A and the edge portion 41B, thereby improving the brightness uniformity of the display panel 100.

Figure 5:
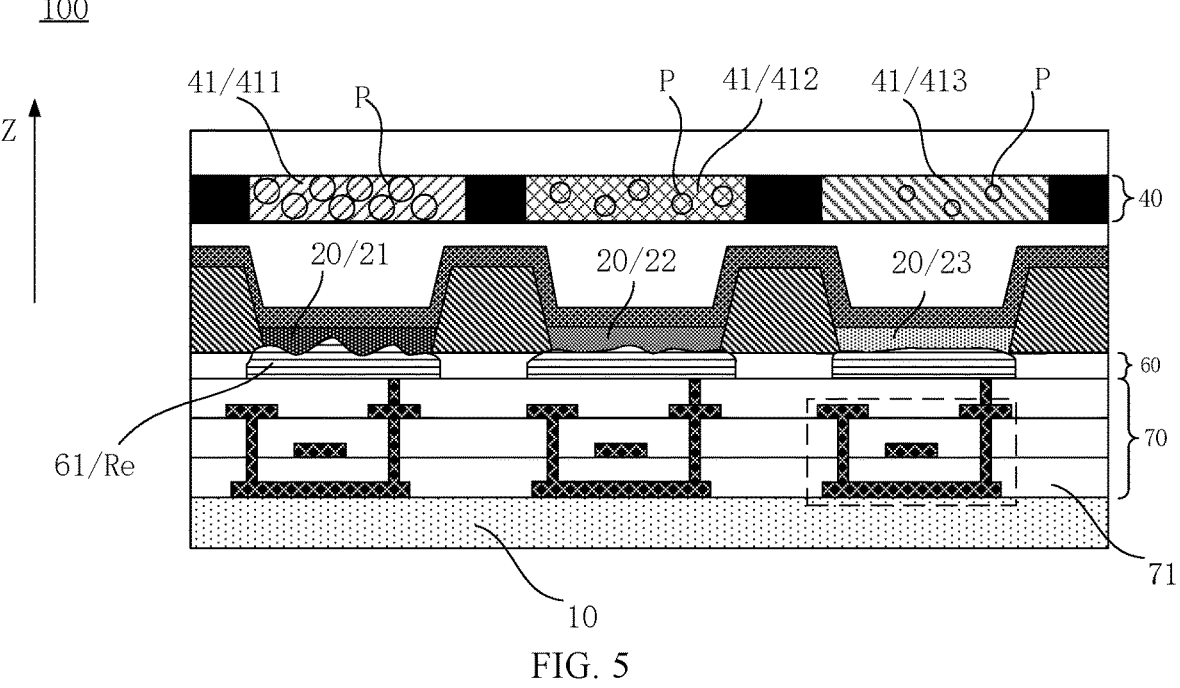
FIG. 5 is a structural schematic diagram of another display panel according to an embodiment of the present disclosure.
Figure 6:
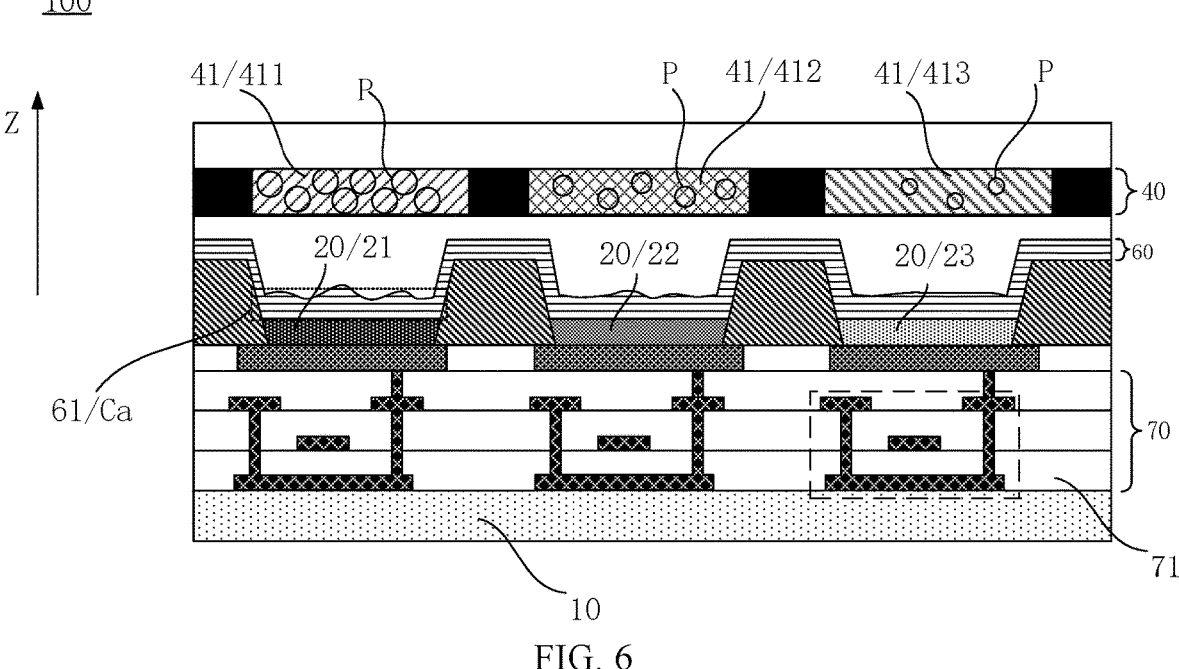
FIG. 6 is a structural schematic diagram of another display panel according to an embodiment of the present disclosure.

FIG. 5 is a structural schematic diagram of another display panel according to an embodiment of the present disclosure, and FIG. 6 is a structural schematic diagram of another display panel according to an embodiment of the present disclosure.

As shown in FIG. 5 and FIG. 6, in an embodiment of the present disclosure, the display panel 100 also includes a first electrode layer 60, and the first electrode layer 60 is located on the side of the filter layer 40 away from a light emitting surface of the display panel 100. The first electrode layer 60 includes first electrodes 61, and the first electrode 61 at least partially overlaps with the color-resistance unit 41 along the direction Z perpendicular to the plane of the display panel 100.

The concentration of the microparticles P in the color-resistance unit 41 increases as the roughness of the first electrode 61 that at least partially overlaps with the color-resistance unit 41 increases.

For example, as shown in FIG. 5 and FIG. 6, color-resistance units 41 include the first color color-resistance unit 411, the second color-resistance unit 412 and the third color color-resistance unit 413.

If a flatness of the first electrode 61 overlapped with the first color color-resistance unit 411 is greater than a flatness of the first electrode 61 overlapped with the second color color-resistance unit 412, and a flatness of the first electrode 61 overlapped with the second color color-resistance unit

412 is greater than a flatness of the first electrode 61 overlapped with the third color color-resistance unit 413 along the direction Z perpendicular to the plane of display panel 100, then the concentration of microparticles P in the first color color-resistance unit 411 is higher than the concentration of microparticles P in the second color color-resistance unit 412, and the concentration of microparticles P in the second color color-resistance unit 412 is higher than the concentration of microparticles P in the third color-resistance unit 413.

In an embodiment, as shown in FIG. 5, the first electrode layer 60 can be located on a side of the light-emitting unit 20 away from the light emitting surface of the display panel 100, and the first electrode 61 can be an anode Re of the light-emitting unit 20. The display panel 100 also includes a transistor array layer 70, and the transistor array layer 70 includes transistors 71 which are used to provide the driving signal to the first electrode 61.

In addition, as shown in FIG. 6, the first electrode layer 60 can also be located between the light-emitting unit 20 and the optical filter layer 40. The first electrode 61 is a cathode Ca of the light-emitting unit 20, and the first electrode 61 receives the public voltage signal.

It should be noted that FIG. 5 and FIG. 6 only show two types of first electrode layer 60. The first electrode layer 60 can also be other metal film layers in display panel 100.

It should be understood that if the first electrode 61 is much less flat, which means the first electrode 61 is more rougher, and the more likely the dispersion problem is to occur for the reflected light generated after the external ambient light is projected on the first electrode 61.

In an embodiment of the present disclosure, the more rougher the first electrode 61 is, the higher concentration the microparticles P in the color-resistance unit 41 has, which is conducive to ensuring that the emitting direction of the reflected light is sufficiently dispersed and the original emitting direction of the reflected light is destroyed, so as to improve the dispersion problem in the display panel 100 and improve the user's experience.

Figure 7:
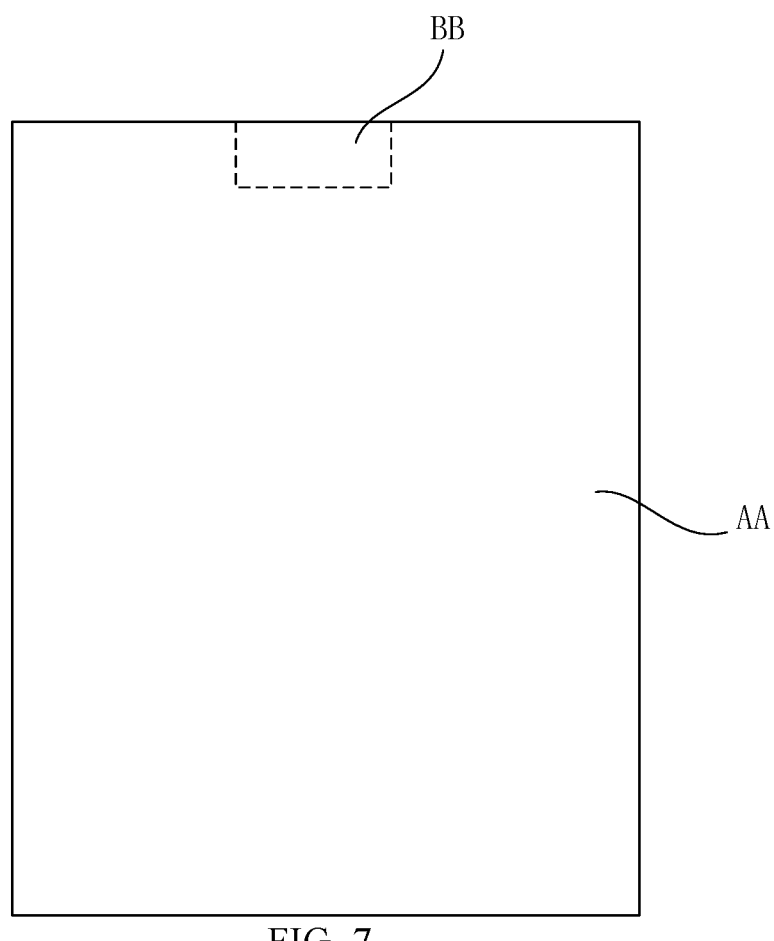
FIG. 7 is a schematic diagram of a display panel according to an embodiment of the present disclosure.
Figure 8:
FIG. 8 is a schematic diagram of another display panel according to an embodiment of the present disclosure.
Figure 8:
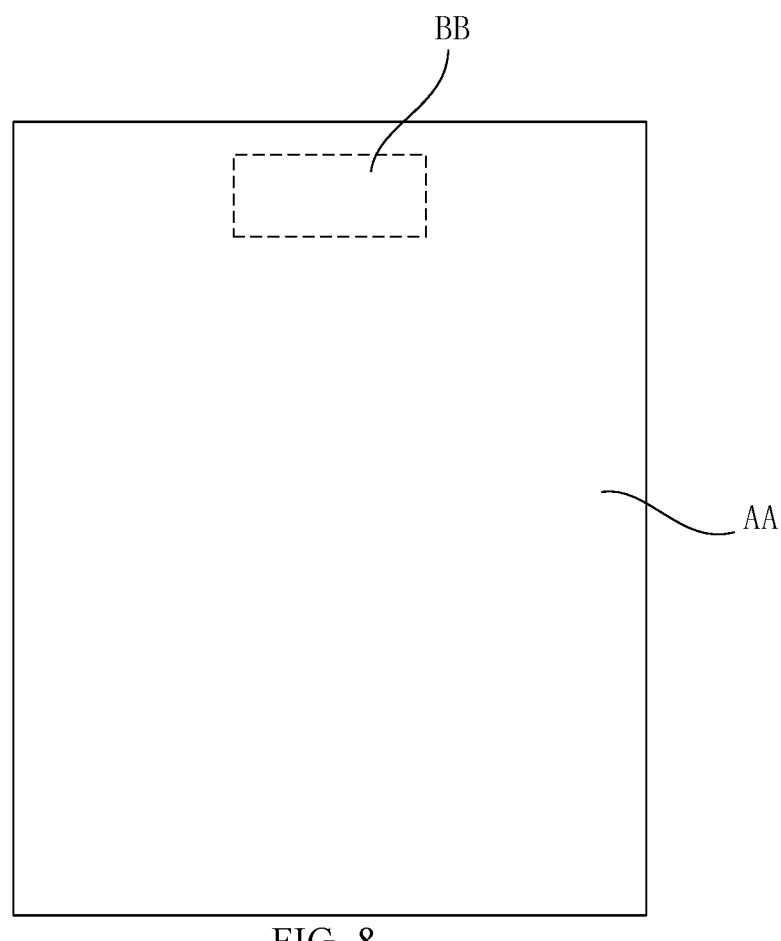
Figure 9:
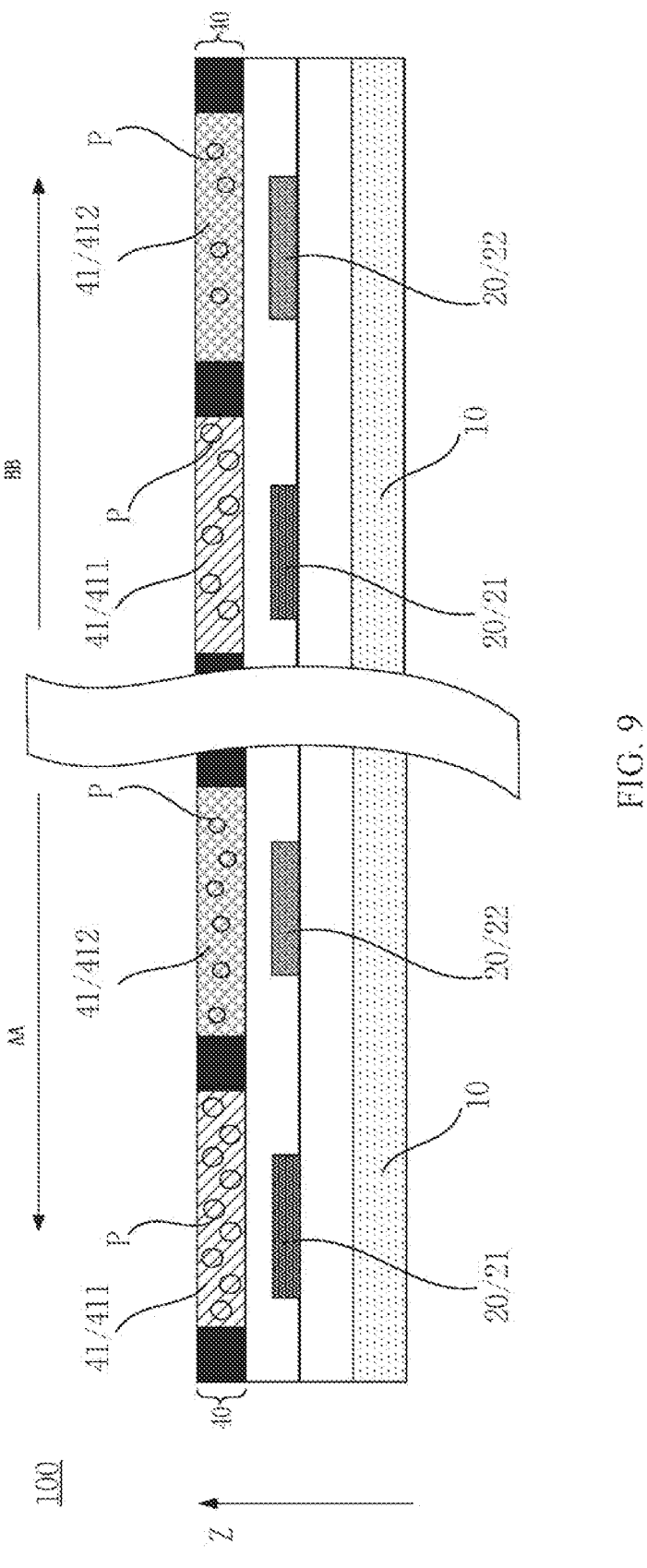
FIG. 9 is a structural schematic diagram of another display panel according to an embodiment of the present disclosure.

FIG. 7 is a schematic diagram of a display panel according to an embodiment of the present disclosure, FIG. 8 is a schematic diagram of another display panel according to an embodiment of the present disclosure, FIG. 9 is a structure schematic diagram of another display panel according to an embodiment of the present disclosure.

In one embodiment of the present disclosure, in view of FIG. 7 and FIG. 9, or in view of FIG. 8 and FIG. 9, the display panel 100 includes a first display area AA and a second display area BB, the first display area AA surrounds at least part of the second display area BB, and a transmittance of the second display area BB is greater than a transmittance of the first display area AA.

As shown in FIG. 7, the first display area AA can surround part of the second display area BB. In addition, as shown in FIG. 8, the first display area AA surrounds all around the second display area BB.

The concentration of the microparticle P in the second display area BB is smaller than the concentration of the microparticle P in the first display area AA.

For example, as shown in FIG. 9, the concentration of the microparticle P in the first color color-resistance unit 411 in the first display area AA is higher than the concentration of microparticle P in the first color color-resistance unit 411 in the second display area BB, and the concentration of microparticle P in the second color color-resistance unit 412 in the first display area AA is higher than the concentration of the microparticle P in the second color color-resistance unit 412 in the second display area BB, so as to ensure that the concentration of the microparticle P in the second display area BB is lower than the concentration of microparticle P in the first display area AA.

It should be noted that FIG. 9 only shows the concentration of the microparticle P in the two types of color color-resistance units 41 in the first display area AA and the second display area BB. In the color-resistance unit 41 with the same color, the concentration of microparticles P in the color color-resistance units 41 located in the first display area AA can be all higher than the concentration of microparticles P in the color-resistance units 41 located in the second display area BB.

In an embodiment of the present disclosure, setting the concentration of microparticle P in the second display area BB with high transmittance to be lower is conducive to ensuring the transmittance of the second display area BB and reducing the impact on the light brightness of the second display area BB. Moreover, in the second display area BB with high transmittance, the pixel density is usually set to be small, resulting in the light brightness of in the second display area BB is lower than the light brightness of in the first display area AA. The concentration of microparticle P in the second display area BB is set to be lower than the concentration of microparticle P of in the first display area AA. It is beneficial to balance the brightness difference between the first display area AA and the second display area BB, so as to improve the light brightness uniformity of display panel 100.

Figure 10:
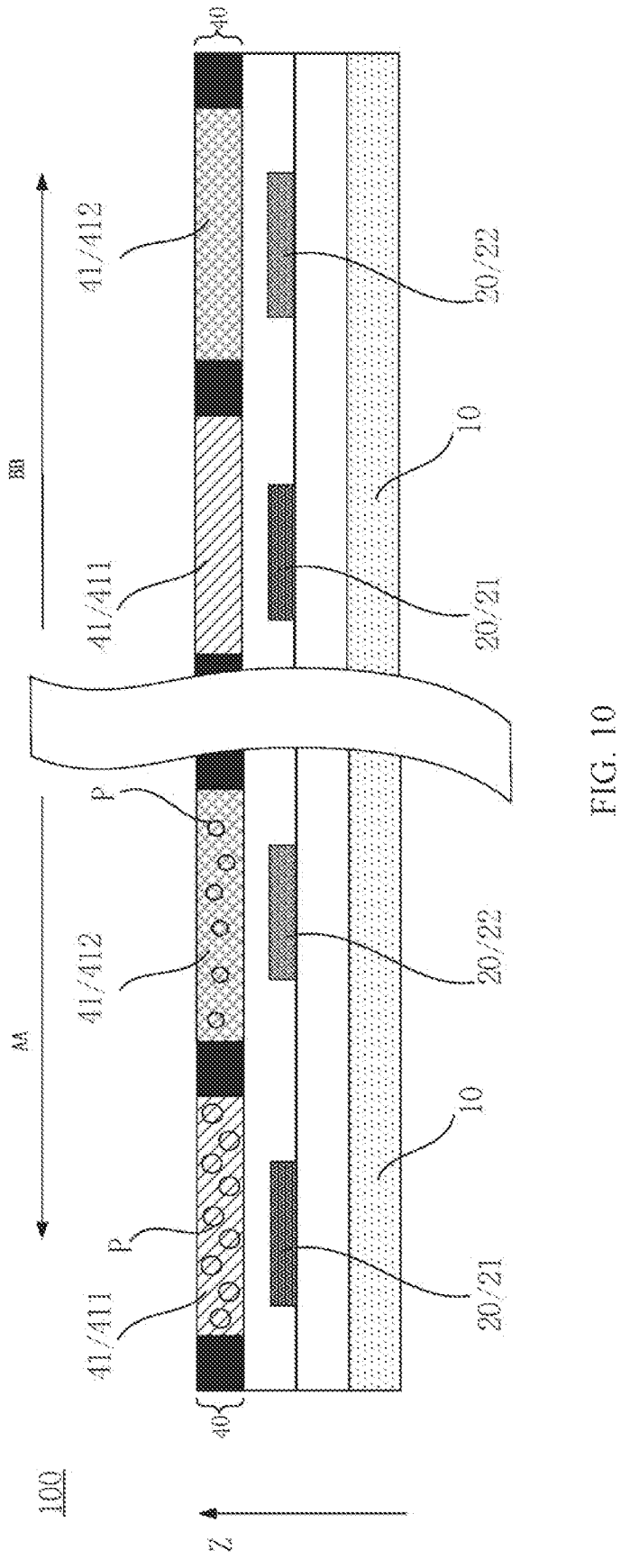
FIG. 10 is a structural schematic diagram of another display panel according to an embodiment of the present disclosure.

FIG. 10 is a structure schematic diagram of another display panel according to an embodiment of the present disclosure.

In an embodiment of the present disclosure, as shown in FIG. 7 and FIG. 10, or in FIG. 8 and FIG. 10, the display panel 100 includes a first display area AA and a second display area BB, the first display area AA surrounds at least part of the second display area BB, the transmittance of the second display area BB is greater than the transmittance of the first display area AA, and no microparticle P is provided in the second display area BB.

In other words, in the display panel 100, the second display area BB with high transmittance is not provided with the microparticle P.

In the embodiment of the present disclosure, it is conducive to further ensuring the transmittance of in the second display area BB and avoiding the influence of microparticle P on the transmittance of in the second display area BB.

Figures 11, 12:
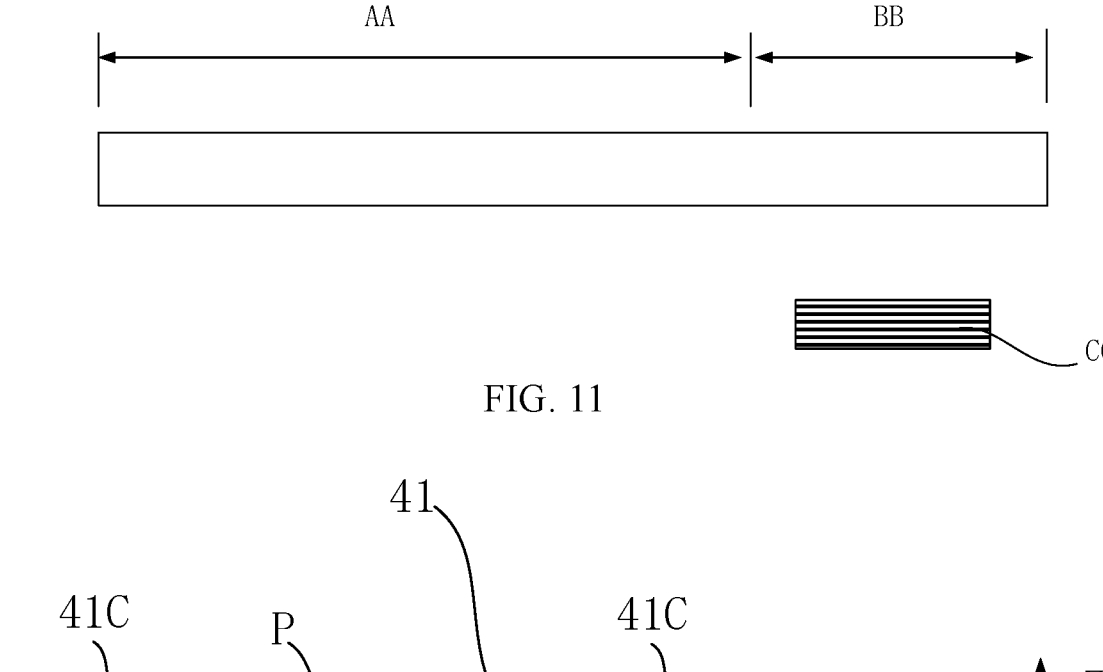
FIG. 11 is a schematic diagram of display device according to an embodiment of the present disclosure.
FIG. 12 is a partial structural schematic diagram of another display panel according to an embodiment of the present disclosure.

FIG. 11 is a schematic diagram of display device according to an embodiment of the present disclosure.

In the display panel 100 as shown in FIG. 7 and FIG. 8, the second display area BB can be used as the light path channel of a light sensing element.

Specifically, as shown in FIG. 11, an embodiment of the present disclosure provides a display device 200, which includes the display panel 100 and the light sensing element CC as shown in FIG. 7 and FIG. 8. the second display area BB overlaps with the light sensing element CC along the direction perpendicular to the plane of the display panel 100, and the light sensing element CC can be at least one of the camera or infrared sensor.

In an embodiment of the present disclosure, as shown in FIG. 9, resistance units 41 include the first color color-resistance unit 411 and the second color color-resistance unit 412, a concentration difference between the concentration of the microparticle P concentration in the first color color-resistance unit 411 in the first display area AA and the concentration of the particle in the first color-resistance unit 411 in the second display area BB is n1; and a concentration difference between the concentration of the microparticle P in the second color color-resistance unit 412 in the first display area AA and the concentration of the particle in the second color color-resistance unit 411 in the second display area BB is n2, and n1≠n2.

Furthermore, the concentration of microparticle P in the first color color-resistance unit 411 in the first display area AA is different from the concentration of microparticle P in the second color color-resistance unit 412, and the concentration of microparticle P in the first color color-resistance unit 411 in the second display area BB is different from the concentration of microparticle P in the second color color-resistance unit 412.

Light-emitting units 20 includes the first color light-emitting unit 21 and the second color light-emitting unit 22. The first color color-resistance unit 411 is at least partially overlapped with the first color light-emitting unit 21, and the second color color-resistance unit 412 is at least partially overlapped with the second color light-emitting unit 22 along the direction perpendicular to the plane of display panel 100.

The first color light emitted by the first color light-emitting unit 21 is emitted through the first color color-resistance unit 411, and the second color light emitted by the second color light-emitting unit 22 is emitted through the second color color-resistance unit 412.

In an embodiment of the present disclosure, it is set that n1≠n2, that is the concentration difference of microparticles P in the first color color-resistance units 411 in the first display area AA and the second display area BB is different from the concentration difference of microparticles P in the second color color-resistance units 412 in the first display area AA and the second display area BB, which is conducive to reducing an attenuation difference between the first color light emitted by the first color light-emitting unit 21 and the second color light emitted by the second color light-emitting unit 22, and balancing the brightness of the first color light and the second color light, thereby avoiding the problem of color stripes in display panel 100 due to the difference in brightness attenuation between the first color light and the second color light.

FIG. 12 is a partial structure schematic diagram of a display panel according to an embodiment of the present disclosure.

In an embodiment of the present disclosure, as shown in FIG. 12, the black matrix 30 includes light shielding portions 32, at least part of the color-resistance unit 41 overlaps with light shielding portion 32 along the direction Z perpendicular to the plane of display panel 100.

No microparticle P is provided in an overlapping part of color-resistance unit 41 and light shielding portion 32.

For example, as shown in FIG. 12, the black matrix opening 31 can be located between adjacent light shielding portions 32, and the color-resistance unit 41 fills the black matrix opening 31 and extends to the surface of light shielding portion 32. The overlapping part between color-resistance unit 41 and light shielding portion 32 is an overlapping part 41C along the direction Z perpendicular to the plane of display panel 100, and no microparticle P is provided in the overlapping part 41C.

In an embodiment of the present disclosure, the light shielding portion 32 can be used to avoid the optical crosstalk between the light emitted by the light-emitting units 20 of different colors, which is beneficial to improve the display effect of the display panel 100. Since a surface reflectivity of the color-resistance unit 41 is usually smaller than a surface reflectivity of the light shielding portion 32, in an embodiment of the present disclosure, the color-resistance unit 41 extends to the surface of the light shielding portion 32, and no microparticle P is provided in an overlapping part of the color-resistance unit 41 and light shielding portion 32, so as to decrease the reflected light generated by external ambient light hitting the display panel 100 and thereby improving the dispersion problem of the display panel 100.

Figure 13:
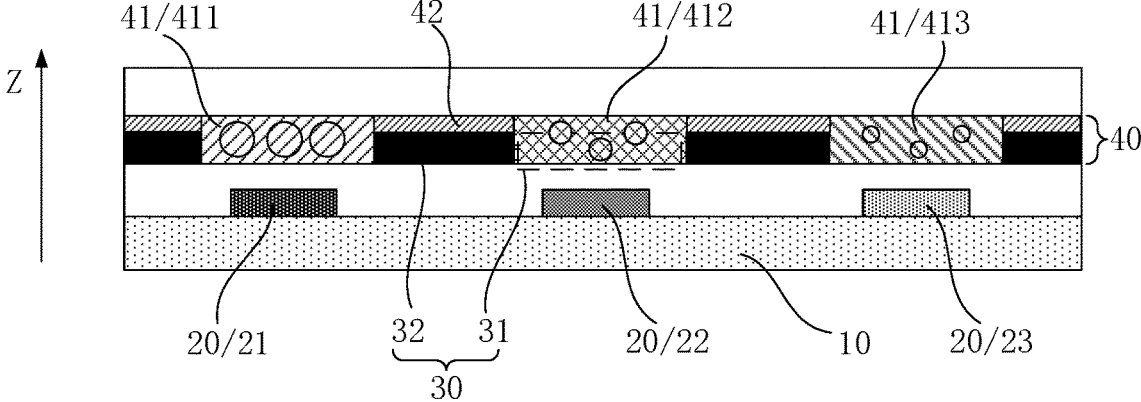
FIG. 13 is a structural schematic diagram of another display panel according to an embodiment of the present disclosure.

FIG. 13 is a structure schematic diagram of another display panel according to an embodiment of the present disclosure.

As shown in FIG. 13, in an embodiment of the present disclosure, the black matrix 30 includes light shielding portions 32 and the filter layer 40 also includes anti-reflection structures 42, which are made of the same material as the red color-resistance unit. The anti-reflection structure 42 is used to reduce the reflected light generated by the external ambient light projected on the display panel 100.

The anti-reflection structure at least partially overlaps with the light shielding portion 32 along the direction Z perpendicular to the plane of display panel 100, and no microparticle P is provided in anti-reflection structure 42.

The light shielding portion 32 can be located between adjacent color-resistance units 41 to avoid optical crosstalk among lights emitted by different color light-emitting units 20.

In the filter layer 40, the first color color-resistance unit 411 can be a red color-resistance unit, the second color color-resistance unit 412 can be a green color-resistance unit, and the third color color-resistance unit 413 can be a blue color-resistance unit. The surface reflectivity of the red color-resistance unit is usually smaller than the surface reflectivity of the green color-resistance unit and smaller than the surface reflectivity of the blue color-resistance unit.

As the surface reflectivity of the color-resistance unit 41 is usually less than the surface reflectivity of light shielding portion, therefore, the anti-reflection structure 42 is set to overlap with the shielding part 32 in an embodiment of the present disclosure, and the anti-reflection structure 42 and the red color-resistance unit are made of the same material, which can further decrease the reflected light generated by external environment light projected on the display panel 100. In addition, if no microparticle P is set in the anti-reflection structure 42, the surface reflectivity of the anti-reflection structure 42 can be ensured to be small, so as to reduce the reflected light generated by external environment light projected on the display panel 100.

Figure 14:
FIG. 14 is a schematic diagram of another display device according to an embodiment of the present disclosure.
Figure 14:
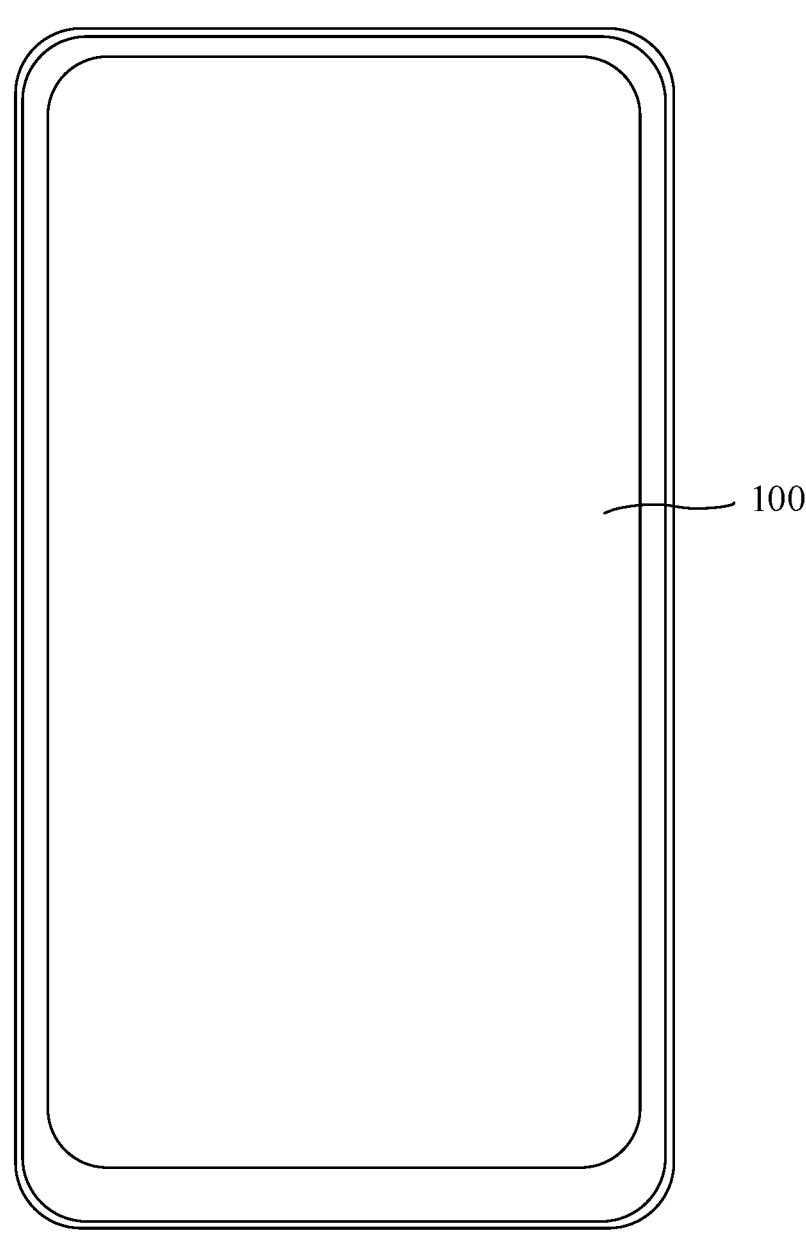

FIG. 14 is a schematic diagram of another display device according to an embodiment of the present disclosure.

In an embodiment of the present disclosure, it provides a display device 200, as shown in FIG. 14, which includes a display panel 100 as provided in the above embodiment. The display device 200 provided in the embodiment of the present disclosure may be a mobile phone, in addition, the display device 200 can also be a computer, television and other electronic equipment.

In the display device 200, by setting the microparticle P in the color-resistance unit 41, and the particle size of the microparticle P is similar to the wavelength of light emitted by corresponding light-emitting unit 20, according to light propagation theory, when the reflected light will disperse after incident on the corresponding color-resistance unit 41, which will alter the original emitting direction of the reflected light and disperse the emitting direction of the reflected light, thereby improving the dispersion problem in display device 200 and user's experience. In addition, when the light emitted by light-emitting unit 20 is emitted through its corresponding color-resistance unit 41, the light is disperse, which can increase the emergent angle, so as to improve the light emergent angle of the display device 200.

The above descriptions are merely preferred embodiments of the present disclosure, and are not intended to limit the present disclosure. Any modifications, equivalent replacements, improvements, and the like made within the spirit and principle of the present disclosure shall fall within the protection scope of the present disclosure.

What is claimed is:

1. A display panel, comprising:

a substrate;

light-emitting units on a side of the substrate;

a black matrix located on a side of the light-emitting units away from the substrate, and defining black matrix openings, wherein one black matrix opening of the black matrix openings corresponds to a light-emitting unit of the light-emitting units; and a filter layer comprising color-resistance units disposed in the black matrix openings and at least partially overlapping with the light-emitting units of the same color in a direction perpendicular to a plane of the display panel;

wherein a color-resistance unit of the color-resistance units comprises microparticles having a particle size, and a difference between the particle size and a wavelength of light emitted by a corresponding light-emitting unit is within a preset range, and the light-emitting units of different colors correspond to different particle sizes of the microparticles of the color-resistance units;

wherein the color-resistance units comprise a first color color-resistance unit and a second color color-resistance unit;

wherein the display panel comprises a first display area and a second display area;

wherein a difference between a concentration of microparticles in the first color-resistance unit located in the first display area and a concentration of microparticles in the first color-resistance unit located in the second display area is n1;

wherein a difference between a concentration of microparticles in the second color-resistance unit located in the first display area and a concentration of microparticles in the second color-resistance unit located in the second display area is n2; and wherein $n1 \neq n2$.

2. The display panel according to claim 1, wherein the light-emitting units comprise a first color light-emitting unit and a second color light-emitting unit, the color-resistance units comprise a first color color-resistance unit and a second color color-resistance unit, each microparticle of the microparticles in the first color color-resistance unit is a first microparticle, and each microparticle of the microparticles in the second color color-resistance unit is a second microparticle;

wherein, a wavelength of a first color light emitted by the first color light-emitting unit is $\lambda 1$, a wavelength of a second color light emitted by the second color light-emitting unit is $\lambda 2$, a particle size of the first microparticle is d1, a particle size of the second microparticle is d2, wherein $(\lambda 1 - \lambda 2)*(d1 - d2) > 0$.

3. The display panel according to claim 2, wherein the light-emitting units further comprise a third color light-emitting unit, the color-resistance units further comprise a third color color-resistance unit, and each microparticle of the microparticles in the third color color-resistance unit is a third microparticle;

wherein, a wavelength of a third color light emitted by the third color light-emitting unit is $\lambda 3$, and a particle size of the third microparticle is d3, wherein $(\lambda 2 - \lambda 3)*(d2 - d3) > 0$.

4. The display panel according to claim 3, wherein $(\lambda 1 - \lambda 2) > (\lambda 2 - \lambda 3)$ and $(d1 - d2) > (d2 - d3)$.

5. The display panel according to claim 4, wherein the first color color-resistance unit is a red color-resistance unit, the second color color-resistance unit is a green color-resistance unit, and the third color color-resistance unit is a blue color-resistance unit.

6. The display panel according to claim 5, further comprising a first film layer which covers the filter layer and comprises a fourth microparticle, wherein a particle size of the fourth microparticle is d4, and d4<d3.

7. The display panel according to claim 6, wherein a refractive index of the fourth microparticle is greater than a refractive index of the third microparticle.

8. The display panel according to claim 5, wherein the particle size of the first microparticles is within a range from 600 nm to 800 nm, the particle size of the second microparticle is within a range from 480 nm to 580 nm, and the particle size of the third microparticle is within a range from 380 nm to 550 nm.

9. The display panel according to claim 1, wherein each of the color-resistance units comprise a middle portion and an edge portion, and a concentration of microparticles in the edge portion is lower than a concentration of microparticles in the middle portion in a same color-resistance unit.

10. The display panel according to claim 1, further comprising a first electrode layer which is located on a side of the filter layer away from a light-emitting surface of the display panel and provided with first electrodes, wherein a first electrode of the first electrodes at least partially overlaps with a corresponding color-resistance unit of the color-resistance units along the direction perpendicular to the plane of the display panel;

wherein a concentration of the microparticles in the corresponding color-resistance unit increases as a roughness of the first electrode that at least partially overlaps with the corresponding color-resistance unit increases.

11. The display panel according to claim 1, wherein a transmittance of the second display area is greater than a transmittance of the first display area; and wherein a concentration of microparticles in the second display area is less than a concentration of microparticles in the first display area.

12. The display panel according to claim 1, wherein a transmittance of the second display area is greater than a transmittance of the first display area; and wherein the second display area comprises no microparticle.

13. The display panel according to claim 1, wherein the black matrix comprises light-shielding portions, and at least part of the color-resistance units overlaps with the light-shielding portions along the direction perpendicular to the plane of the display panel;

wherein, a part of the color-resistance units that overlaps with the light-shielding portions is provided with no microparticles.

14. The display panel according to claim 1, wherein the black matrix comprises light-shielding portions; the filter layer is provided with anti-reflection structures, the anti-reflection structures and a red color-resistance unit comprise a same material; and wherein the anti-reflection structures at least partially overlap with the light-shielding portions along the direction perpendicular to the plane of the display panel, and the anti-reflection structures comprise no microparticles.

15. The display panel according to claim 1, wherein at least part of pigment particles in the color-resistance units are the microparticles.

16. The display panel according to claim 1, wherein the microparticles are at least one of titanium oxide particles, silica particles, and zirconia particles.

17. A display device comprising the display panel, wherein the display panel comprises:

a substrate;

light-emitting units on a side of the substrate;

a black matrix, located on a side of the light-emitting units away from the substrate, and provided with black matrix openings, wherein a black matrix opening of the black matrix openings corresponds to a light-emitting unit of the light-emitting units; and a filter layer, comprising color-resistance units disposed in the black matrix openings and at least partially overlap with the light-emitting units of the same color in a direction perpendicular to a plane of the display panel;

wherein a color-resistance unit of the color-resistance units comprises microparticles having a particle size, and a different between the particle size and a wavelength of light emitted by a corresponding light emitting unit is within a preset range, and the light-emitting units of different colors correspond to different particle sizes of the microparticles of the color-resistance units;

wherein the color-resistance units comprise a first color color-resistance unit and a second color color-resistance unit;

wherein the display panel comprises a first display area and a second display area;

wherein a difference between a concentration of microparticles in the first color-resistance unit located in the first display area and a concentration of microparticles in the first color-resistance unit located in the second display area is n1;

wherein a difference between a concentration of microparticles in the second color-resistance unit located in the first display area and a concentration of microparticles in the second color-resistance unit located in the second display area is n2; and wherein n1/n2.

18. The display device according to claim 17, wherein the light-emitting units comprise a first color light-emitting unit and a second color light emitting unit, the color-resistance units comprise a first color color-resistance unit and a second color color-resistance unit, each microparticle of the microparticles in the first color color-resistance unit is a first microparticle, and each microparticle of the microparticles in the second color color-resistance unit is a second microparticle;

wherein, a wavelength of a first color light emitted by the first color light-emitting unit is $\lambda 1$, a wavelength of a second color light emitted by the second color light-emitting unit is $\lambda 2$, a particle size of the first microparticle is d1, a particle size of the second microparticle is d2, wherein $(\lambda 1 - \lambda 2)*(d1 - d2) > 0$;

wherein the light-emitting units further comprise a third color light-emitting unit, the color-resistance units further comprise a third color color-resistance unit, and each microparticle of the microparticles in the third color color-resistance unit is a third microparticle;

wherein, a wavelength of a third color light emitted by the third color light-emitting unit is $\lambda 3$, and a particle size of the third microparticle is d3, wherein $(\lambda 2 - \lambda 3)*(d2 - d3) > 0$, wherein $(\lambda 1 - \lambda 2) > (\lambda 2 - \lambda 3)$ and $(d1 - d2) > (d2 - d3)$.

19. The display device according to claim 17, further comprising a first electrode layer which is located on a side of the filter layer away from a light-emitting surface of the display panel and provided with first electrodes, wherein a first electrode of the first electrodes at least partially overlaps with a corresponding color-resistance unit of the color-resistance units along the direction perpendicular to the plane of the display panel;

wherein a concentration of the microparticles in the corresponding color-resistance unit increases as a roughness of the first electrode that at least partially overlaps with the corresponding one color-resistance unit increases.

20. A display panel comprises:

a substrate;

light-emitting units on a side of the substrate;

a black matrix located on a side of the light-emitting units away from the substrate, and provided with black matrix openings, wherein a black matrix opening of the black matrix openings corresponds to a light-emitting unit of the light-emitting units; and a filter layer comprising color-resistance units disposed in the black matrix openings and at least partially overlapping with the light-emitting units of the same color in a direction perpendicular to a plane of the display panel;

wherein a color-resistance unit of the color-resistance units comprises microparticles having a particle size, and a difference between the particle size and a wavelength of light emitted by a corresponding light emitting unit is within a preset range, and the light-emitting units of different colors correspond to different particle sizes of the microparticles of the color-resistance units;

wherein the black matrix comprises light-shielding portions, and at least part of the color-resistance units overlaps with the light-shielding portions along the direction perpendicular to the plane of the display panel; and wherein a part of the color-resistance units that overlaps with the light-shielding portions is provided with no microparticles.

\* \* \* \* \*